United States Patent
Colvin et al.

(10) Patent No.: US 9,941,087 B2
(45) Date of Patent: Apr. 10, 2018

(54) ION SOURCE CATHODE SHIELD

(71) Applicant: Axcelis Technologies, Inc., Beverly, MA (US)

(72) Inventors: Neil K. Colvin, Merrimack, NH (US); Tseh-Jen Hsieh, Rowley, MA (US); Paul b. Silverstein, Somerville, MA (US)

(73) Assignee: Axcells Technologies, Inc., Beverly, MA (US)

( * ) Notice: Subject to any disclaimer, the term of this patent is extended or adjusted under 35 U.S.C. 154(b) by 0 days.

(21) Appl. No.: 15/410,711

(22) Filed: Jan. 19, 2017

(65) Prior Publication Data

US 2017/0207054 A1 Jul. 20, 2017

Related U.S. Application Data

(60) Provisional application No. 62/280,567, filed on Jan. 19, 2016.

(51) Int. Cl.
*H01J 7/24* (2006.01)
*H05B 31/26* (2006.01)
(Continued)

(52) U.S. Cl.
CPC ............ *H01J 17/06* (2013.01); *H01J 17/186* (2013.01); *H01J 27/022* (2013.01); *H01J 27/08* (2013.01)

(58) Field of Classification Search
CPC ........ H01J 17/06; H01J 17/186; H01J 27/022; H01J 27/08
(Continued)

(56) References Cited

U.S. PATENT DOCUMENTS

| 5,262,652 A | 11/1993 | Bright |
| 5,497,006 A | 3/1996 | Sferiazzo et al. |

(Continued)

FOREIGN PATENT DOCUMENTS

JP 2010073387 A 4/2010

OTHER PUBLICATIONS

Non-Final Office Action dated Aug. 3, 2017 in connection with U.S. Appl. No. 15/344,502.
(Continued)

*Primary Examiner* — Daniel D Chang
(74) *Attorney, Agent, or Firm* — Eschweiler & Potashnik, LLC

(57) ABSTRACT

An ion source has an arc chamber having an arc chamber body. An electrode extends into an interior region of the arc chamber body, and a cathode shield has a body that is cylindrical having an axial hole. The axial hole is configured to pass the electrode therethrough. First and second ends of the body have respective first and second gas conductance limiters. The first gas conductance limiter extends from an outer diameter of the body and has a U-shaped lip. The second gas conductance limiter has a recess for a seal to protect the seal from corrosive gases and maintain an integrity of the seal. A gas source introduces a gas to the arc chamber body. A liner has an opening configured to pass the cathode shield therethrough, where the liner has a recess. A gap is defined between the U-shaped lip and the liner, wherein the U-shaped lip reduces a conductance of gas into the gap and the recess further reduces conductance of gas into the region.

16 Claims, 7 Drawing Sheets

(51) Int. Cl.
*H01J 17/06* (2006.01)
*H01J 17/18* (2012.01)
*H01J 27/08* (2006.01)
*H01J 27/02* (2006.01)

(58) Field of Classification Search
USPC .................................... 315/111.91; 250/426
See application file for complete search history.

(56) References Cited

U.S. PATENT DOCUMENTS

| | | |
|---|---|---|
| 6,501,078 B1 | 12/2002 | Ryding et al. |
| 9,006,690 B2 | 4/2015 | Colvin et al. |
| 2006/0030134 A1 | 2/2006 | Kim et al. |
| 2008/0230713 A1* | 9/2008 | Huang .................... H01J 27/08 250/426 |
| 2009/0008570 A1 | 1/2009 | Chen |
| 2011/0156570 A1* | 6/2011 | Jerez ...................... H01J 27/08 313/275 |
| 2011/0240889 A1 | 10/2011 | Colvin et al. |
| 2012/0013249 A1 | 1/2012 | Jerez |
| 2015/0179393 A1 | 6/2015 | Colvin et al. |
| 2015/0270100 A1 | 9/2015 | Jerez et al. |

OTHER PUBLICATIONS

International Search Report and the Written Opinion of the International Searching Authority, dated Feb. 21, 2017 for PCT/US2016/060570.

International Search Report dated Jun. 7, 2017 for PCT/US2017/025845.

Notice of Allowance dated Jan. 22, 2018 in connection with U.S. Appl. No. 15/344,502.

* cited by examiner

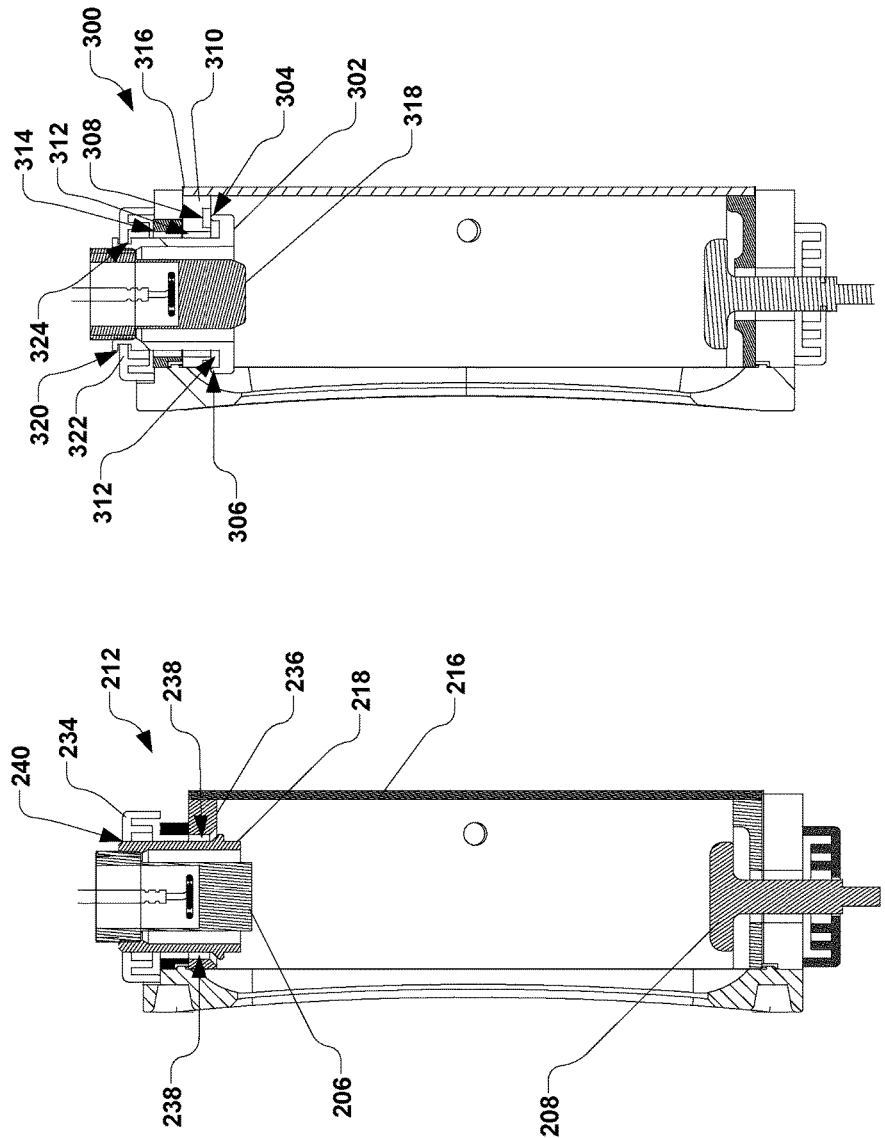

ION SOURCE CATHODE SHIELD

REFERENCE TO RELATED APPLICATIONS

This application claims the benefit of U.S. Provisional Application No. 62/280,567 filed Jan. 19, 2016, entitled "IMPROVED ION SOURCE CATHODE SHIELD", the contents of which are herein incorporated by reference in their entirety.

TECHNICAL FIELD

The present invention relates generally to ion implantation systems, and more specifically to an improved shield for a cathode of an ion source that improves a lifetime of a boron nitride seal, thus generally preventing leakage of gas out of the ion source.

BACKGROUND

In the manufacture of semiconductor devices, ion implantation is used to dope semiconductors with impurities. Ion implantation systems are often utilized to dope a workpiece, such as a semiconductor wafer, with ions from an ion beam, in order to either produce n- or p-type material doping, or to form passivation layers during fabrication of an integrated circuit. Such beam treatment is often used to selectively implant the wafers with impurities of a specified dopant material, at a predetermined energy level, and in controlled concentration, to produce a semiconductor material during fabrication of an integrated circuit. When used for doping semiconductor wafers, the ion implantation system injects a selected ion species into the workpiece to produce the desired extrinsic material. Implanting ions generated from source materials such as antimony, arsenic, or phosphorus, for example, results in an "n-type" extrinsic material wafer, whereas a "p-type" extrinsic material wafer often results from ions generated with source materials such as boron, gallium, or indium.

A typical ion implanter includes an ion source, an ion extraction device, a mass analysis device, a beam transport device and a wafer processing device. The ion source generates ions of desired atomic or molecular dopant species. These ions are extracted from the source by an extraction system, typically a set of electrodes, which energize and direct the flow of ions from the source, forming an ion beam. Desired ions are separated from the ion beam in a mass analysis device, typically a magnetic dipole performing mass dispersion or separation of the extracted ion beam. The beam transport device, typically a vacuum system containing a series of focusing devices, transports the ion beam to the wafer processing device while maintaining desired properties of the ion beam. Finally, semiconductor wafers are transferred in to and out of the wafer processing device via a wafer handling system, which may include one or more robotic arms, for placing a wafer to be treated in front of the ion beam and removing treated wafers from the ion implanter.

Ion sources (commonly referred to as arc ion sources) generate ion beams used in implanters and can include heated filament cathodes for creating ions that are shaped into an appropriate ion beam for wafer treatment. U.S. Pat. No. 5,497,006 to Sferlazzo et al., for example, discloses an ion source having a cathode supported by a base and positioned with respect to a gas confinement chamber for ejecting ionizing electrons into the gas confinement chamber. The cathode of the Sferlazzo et al. is a tubular conductive body having an endcap that partially extends into the gas confinement chamber. A filament is supported within the tubular body and emits electrons that heat the endcap through electron bombardment, thereby thermionically emitting ionizing electrons into the gas confinement chamber.

Conventional ion source utilize gases such as fluorine or other volatile corrosive species. Seals associated with the cathode that can etch the inner diameter of cathode seals over time, thereby allowing the volatile gases to escape and damage nearby insulators, such as a cathode assembly insulator. This leakage will shorten the useful lifetime of the ion source, thus resulting in shutting down of the ion implanter in order to replace parts therein.

SUMMARY

The present disclosure thus provides a system and apparatus for increasing the lifetime of an ion source. Accordingly, the following presents a simplified summary of the disclosure in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

In accordance with one aspect of the disclosure, a cathode shield for an ion source is provided. The cathode shield comprises a body, wherein the body is generally cylindrical and has an axial hole defined therethrough. The axial hole, for example, is configured to pass an electrode, such as a cathode, therethrough. A first gas conductance limiter is further associated with a first end of the body. The first gas conductance limiter, for example, extends radially outward from a first outer diameter of the body, wherein the first gas conductance limiter comprises a U-shaped lip extending axially from the first end of the body toward a second end of the body.

A second gas conductance limiter may be further associated with the second end of the body. The second gas conductance limiter extends radially inward from the first outer diameter of the body, wherein the second gas conductance limiter has a surface configured to accept a seal. The surface, for example, is configured to generally surround at least a portion of the seal.

According to one example, the U-shaped lip is configured to mate to a recess in a liner of the ion source. A gap, for example, is defined between the U-shaped lip and the liner, and wherein the U-shaped lip substantially reduces a conductance of gas into the gap. In one example, the gap is further defined between the cathode shield and a hole in an arc chamber body.

The second gas conductance limiter of the cathode shield, for example, may further comprise a labyrinth seal, wherein the labyrinth seal is generally defined in a second outer diameter of the body. The labyrinth seal may be configured to accept a boron nitride seal. In one example, the labyrinth seal generally protects a sealing surface associated with the boron nitride seal from corrosive gases associated with the ion source by reducing a gas conductance of the corrosive gases into an area associated with the labyrinth seal.

In accordance with another exemplary aspect, an arc chamber for an ion source is provided. The arc chamber, for example, comprises an arc chamber body and an electrode extending into an interior region of the arc chamber body. The arc chamber further comprises the cathode shield.

According to one example, a liner is further associated with the arc chamber body, wherein the liner has an opening configured to pass the cathode shield therethrough. The liner, for example, has a recess defined therein, and wherein a gap is defined between the U-shaped lip of the cathode shield and the liner, wherein the U-shaped lip substantially reduces a conductance of gas into the gap. In one example, the gap is further defined between the cathode shield and a hole in an arc chamber body.

In another example, the boron nitride seal may be further disposed between the labyrinth seal and the arc chamber body, wherein the boron nitride seal electrically insulates the electrode from the arc chamber body. The labyrinth seal, for example, generally protects a sealing surface associated with the boron nitride seal from corrosive gases associated with the ion source by reducing a gas conductance of the corrosive gases into an area associated with the labyrinth seal.

In accordance with another exemplary aspect of the disclosure, an ion source, such as an ion source for an ion implantation system, is provided. The ion source, for example, comprises the arc chamber and a gas source, wherein the gas source is further configured to introduce a gas to the interior region of the arc chamber body.

In another example, the ion source further comprises a repeller disposed opposite the cathode. An arc slit may be further provided in the arc chamber for extraction of ions from the arc chamber.

To the accomplishment of the foregoing and related ends, the disclosure comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 4 illustrates a cross sectional view of a conventional arc chamber.

FIG. 5 illustrates a cross sectional view of an exemplary arc chamber in accordance with various aspects of the present disclosure.

DETAILED DESCRIPTION

Figure 1:
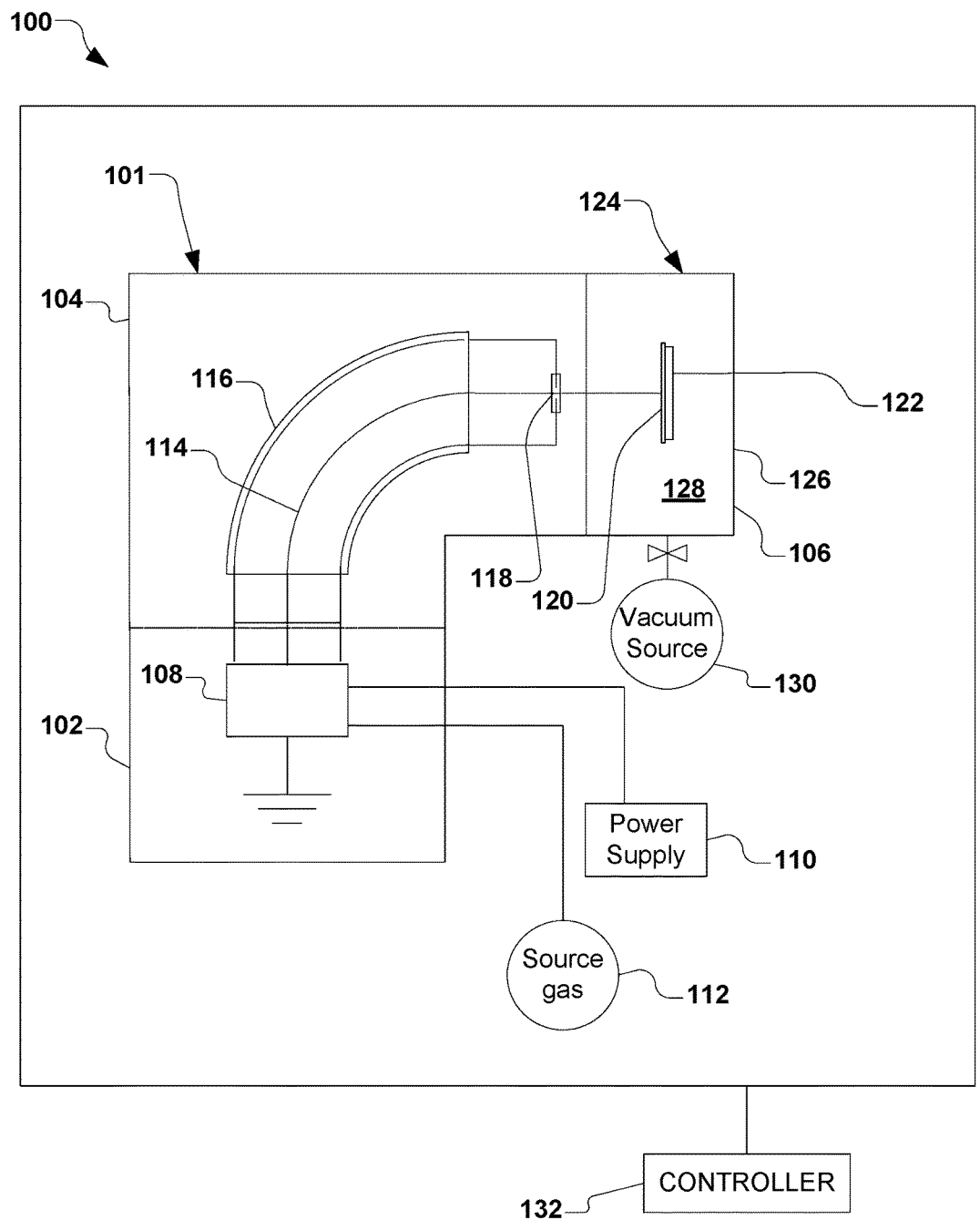
FIG. 1 is a block diagram of an exemplary vacuum system utilizing an ion source cathode shield in accordance with several aspects of the present disclosure.

The present disclosure is directed generally toward an ion implantation system and an ion source associated therewith. More particularly, the present disclosure is directed toward a system and apparatus for increasing the lifetime of the ion source and decreasing maintenance and improving productivity of the ion source, wherein an improved cathode shield is provided for said ion source.

Accordingly, the present invention will now be described with reference to the drawings, wherein like reference numerals may be used to refer to like elements throughout. It is to be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details. Further, the scope of the invention is not intended to be limited by the embodiments or examples described hereinafter with reference to the accompanying drawings, but is intended to be only limited by the appended claims and equivalents thereof.

It is also noted that the drawings are provided to give an illustration of some aspects of embodiments of the present disclosure and therefore are to be regarded as schematic only. In particular, the elements shown in the drawings are not necessarily to scale with each other, and the placement of various elements in the drawings is chosen to provide a clear understanding of the respective embodiment and is not to be construed as necessarily being a representation of the actual relative locations of the various components in implementations according to an embodiment of the invention. Furthermore, the features of the various embodiments and examples described herein may be combined with each other unless specifically noted otherwise.

It is also to be understood that in the following description, any direct connection or coupling between functional blocks, devices, components, circuit elements or other physical or functional units shown in the drawings or described herein could also be implemented by an indirect connection or coupling. Furthermore, it is to be appreciated that functional blocks or units shown in the drawings may be implemented as separate features or components in one embodiment, and may also or alternatively be fully or partially implemented in a common feature or component in another embodiment.

In accordance with one aspect of the present disclosure, FIG. 1 illustrates an exemplary vacuum system 100. The vacuum system 100 in the present example comprises an ion implantation system 101, however various other types of vacuum systems are also contemplated, such as plasma processing systems, or other semiconductor processing systems. The ion implantation system 101, for example, comprises a terminal 102, a beamline assembly 104, and an end station 106.

Generally speaking, an ion source 108 in the terminal 102 is coupled to a power supply 110, whereby a source gas 112 (also called a dopant gas) supplied thereto is ionized into a plurality of ions to form an ion beam 114. The ion beam 114 in the present example is directed through a beam-steering apparatus 116, and out an aperture 118 towards the end station 106. In the end station 106, the ion beam 114 bombards a workpiece 120 (e.g., a semiconductor such as a silicon wafer, a display panel, etc.), which is selectively clamped or mounted to a chuck 122 (e.g., an electrostatic chuck or ESC). Once embedded into the lattice of the workpiece 120, the implanted ions change the physical and/or chemical properties of the workpiece. Because of this, ion implantation is used in semiconductor device fabrication and in metal finishing, as well as various applications in materials science research.

The ion beam 114 of the present disclosure can take any form, such as a pencil or spot beam, a ribbon beam, a scanned beam, or any other form in which ions are directed toward end station 106, and all such forms are contemplated as falling within the scope of the disclosure.

According to one exemplary aspect, the end station 106 comprises a process chamber 124, such as a vacuum chamber 126, wherein a process environment 128 is associated with the process chamber. The process environment 128 generally exists within the process chamber 124, and in one example, comprises a vacuum produced by a vacuum source 130 (e.g., a vacuum pump) coupled to the process chamber and configured to substantially evacuate the process chamber. Further, a controller 132 is provided for overall control of the vacuum system 100.

The present disclosure provides an apparatus configured to increase utilization and decrease downtime of the ion source 108 in the ion implantation system 101 discussed above. It shall be understood, however, that the apparatus of the present disclosure may be also implemented in other semiconductor processing equipment such as CVD, PVD, MOCVD, etching equipment, and various other semiconductor processing equipment, and all such implementations are contemplated as falling within the scope of the present disclosure. The apparatus of the present disclosure advantageously increases the length of usage of the ion source 108 between preventive maintenance cycles, and thus increases overall productivity and lifetime of the system vacuum 100.

The ion source 108 (also called an ion source chamber), for example, can be constructed using refractory metals (W, Mo, Ta, etc.) and graphite in order to provide suitable high temperature performance, whereby such materials are generally accepted by semiconductor chip manufacturers. The source gas 112 is used within the ion source 108, wherein source gas may or may not be conductive in nature. However, once the source gas 112 is cracked or fragmented, the ionized gas by-product can be very corrosive.

One example of a source gas 112 is boron tri-fluoride ($BF_3$), which can be used as a source gas to generate Boron-11 or $BF_2$ ion beams in the ion implantation system 101. During ionization of the $BF_3$ molecule, three free fluorine radicals are generated. Refractory metals, such as molybdenum and tungsten, can be used to construct or line the ion source chamber 108 in order to sustain its structural integrity at an operating temperature of around approximately 700° C. However, refractory fluoride compounds are volatile and have very high vapor pressures even at room temperature. The fluorine radicals formed within the ion source chamber 108 attack the tungsten metal (molybdenum or graphite) and form tungsten hexafluoride ($WF_6$) (molybdenum or carbon fluoride):

$$WF_6 \rightarrow W^+ + 6F^- \quad (1)$$

or $$(MoF_6 \rightarrow Mo^+ + 6F^-) \quad (2)$$

Figure 2:
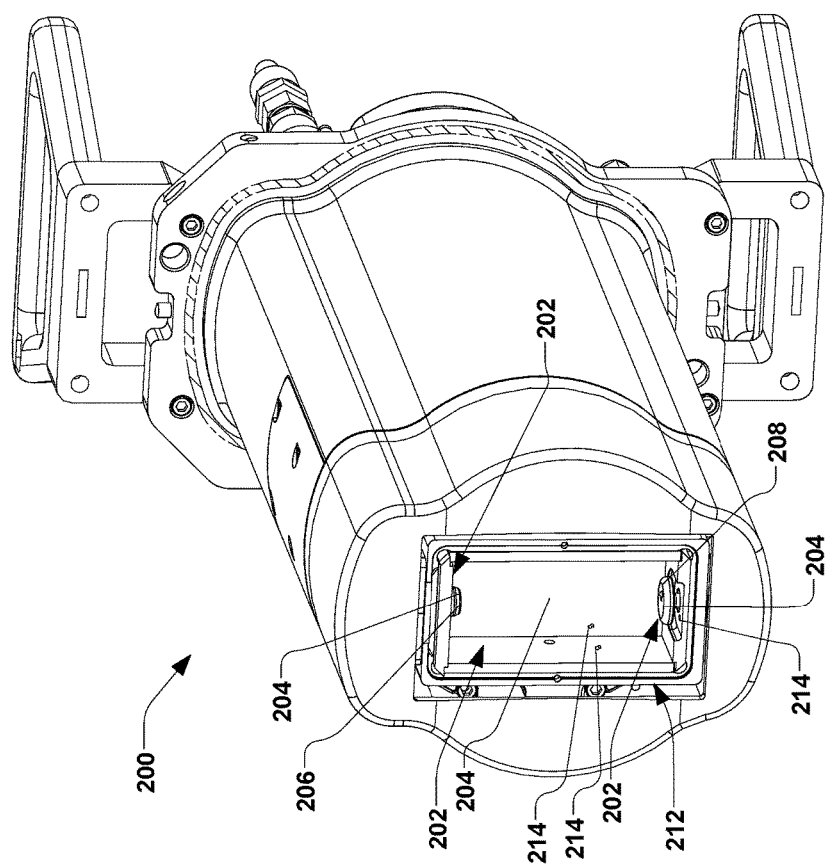
FIG. 2 illustrates a perspective view of an ion source in accordance with various aspects of the present disclosure.
Figure 3:
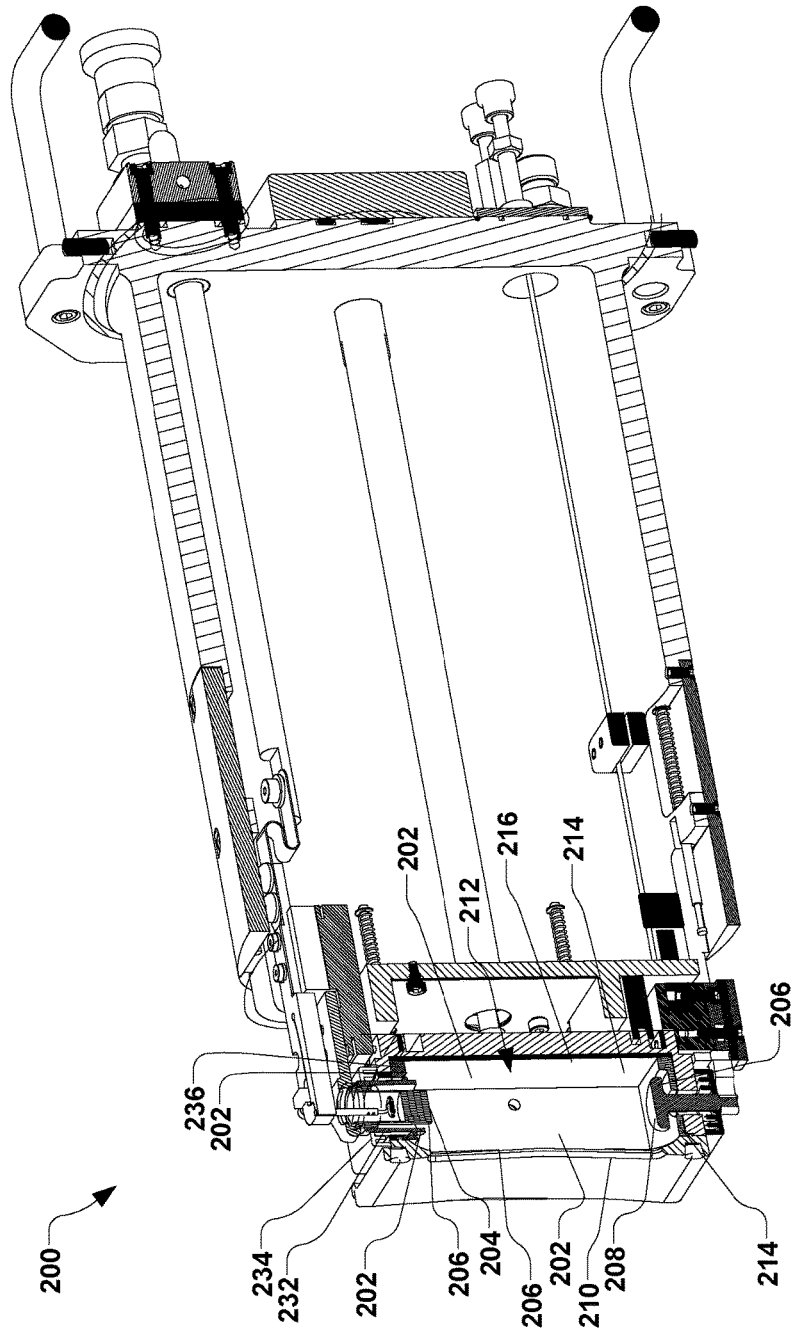
FIG. 3 illustrates a cross sectional perspective view of a conventional ion source.

Tungsten hexafluoride will typically decompose on hot surfaces. For example, an ion source 200 is illustrated in FIGS. 2-3, whereby the tungsten hexafluoride or other resultant material may decompose onto surfaces 202 of various internal components 204 of the ion source, such as on surfaces of a cathode 206, a repeller 208 and arc slit optics 210 (illustrated in FIG. 3) associated an arc chamber 212 of the ion source. This is called a halogen cycle as shown in equation (1), but the resultant material can also precipitate and/or condense back onto the surfaces 202 of the arc chamber 212, as well as the arc slit optics 210 in the form of a contaminant material 214 (e.g., solid-state particulate contaminants or conductive films).

Another source of contaminant material 214 deposited onto the internal components arises from the cathode 206 when the cathode is indirectly heated (e.g., a cathode composed of tungsten or tantalum), whereby the indirectly heated cathode is used to start and sustain the ion source plasma (e.g., a thermionic electron emission). The indirectly heated cathode 206 and the repeller 208 (e.g., an anti-cathode), for example, are at a negative potential in relation to a body 216 of the arc chamber 212, and both the cathode and repeller can be sputtered by the ionized gases. The repeller 208, for example, can be constructed from tungsten, molybdenum, or graphite. Yet another source of contaminant material 214 deposited on the internal components of the arc chamber 212 is the dopant material (not shown), itself. Over time, these deposited films of contaminant material 214 (e.g., electrically conductive material) can coat the surfaces 202, in particular, surfaces proximate to the cathode 206, thereby shortening the life of the ion source 200.

One example of a conventional arc chamber 230 is illustrated in FIG. 3, where a conventional cathode shield 232, cathode seal 234, and cathode liner 236 are provided, whereby the conventional cathode shield and cathode seal are intended to isolate the cathode 206 from the body 216 of the arc chamber 212, as will be understood by one of skill in the art upon viewing the present disclosure. Over time, the use of such a conventional cathode shield 232 and cathode seal 234, however, will typically permit the ionized gases (e.g., fluorine or other volatile corrosive gas species) to enter a gap 238 between the conventional cathode shield and cathode liner 236, thus etching an inner diameter 240 of the cathode seal. Such etching permits the ionized gases to escape and damage any nearby components, such as insulators associated with the cathode 206. Thus, the useful lifetime of the ion source 200 will be shortened due to the etching, and downtime associated with the maintenance and/or replacement of the ion source or components would be expected.

Figure 6:
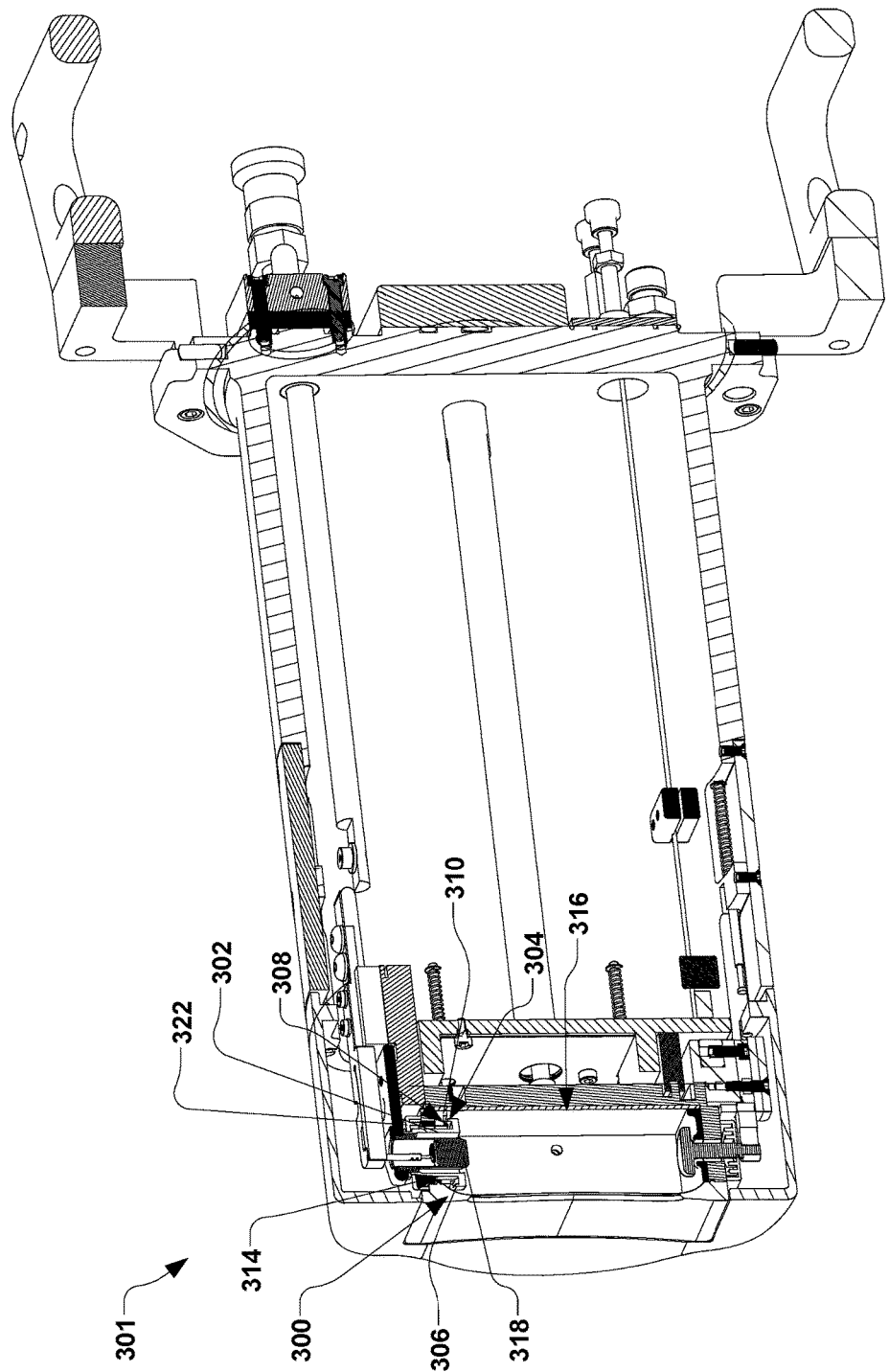
FIG. 6 illustrates a cross sectional perspective view of an exemplary ion source in accordance with various aspects of the present disclosure.
Figure 7B:
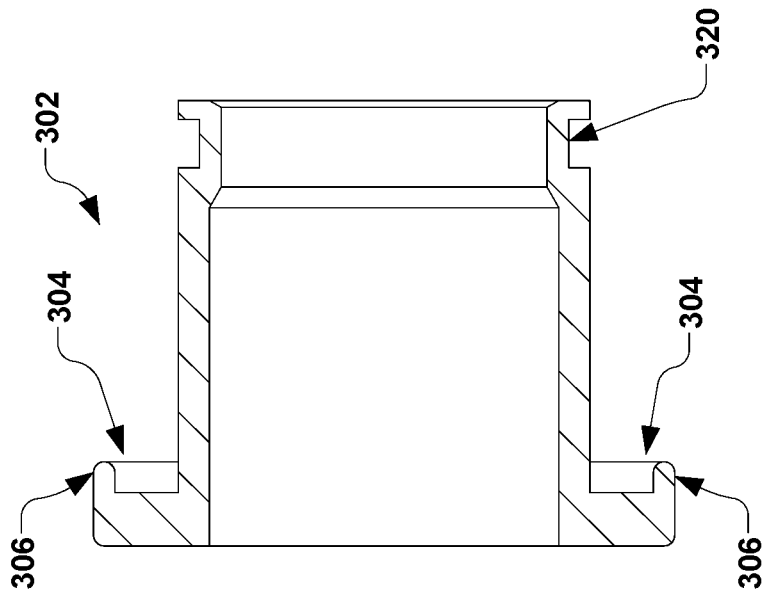
FIG. 7B illustrates a cross sectional view of an exemplary ion source cathode shield in accordance with various aspects of the present disclosure.
Figure 7A:
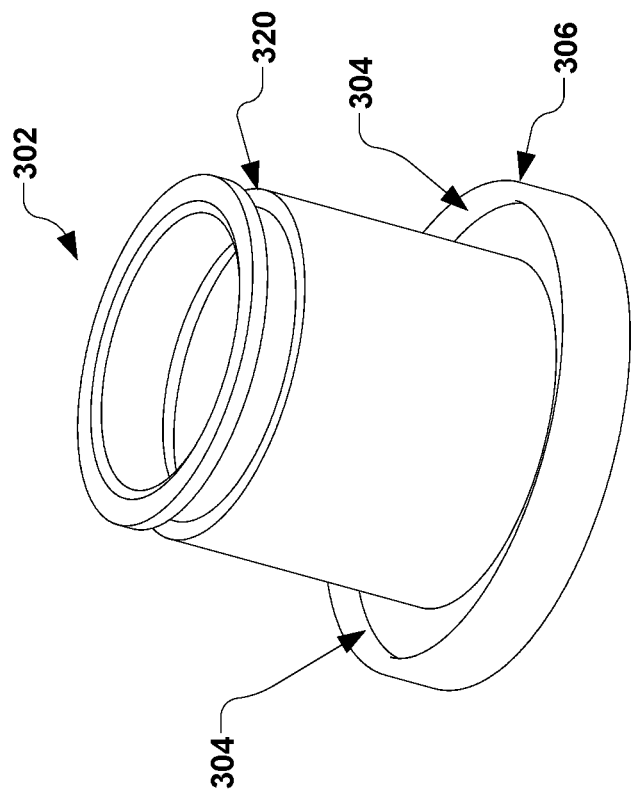
FIG. 7A illustrates a perspective view of an exemplary ion source cathode shield in accordance with various aspects of the present disclosure.
Figure 8:
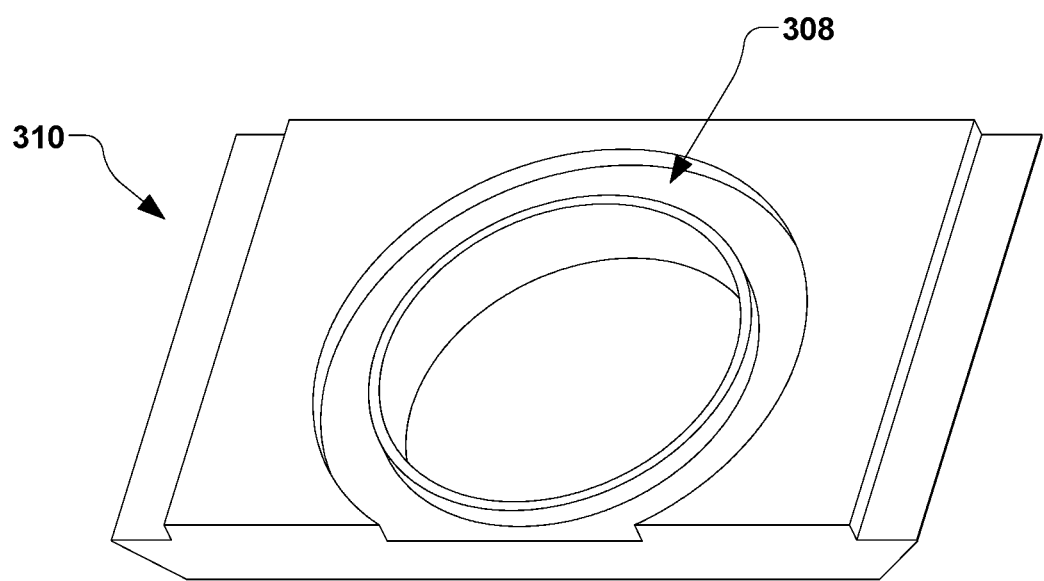
FIG. 8 illustrates a perspective view of an arc chamber liner configured to accept the ion source cathode shield of FIGS. 7A-7B in accordance with various aspects of the present disclosure.

In order to remedy such issues associated with conventional devices, in accordance with one exemplary aspect of the present disclosure, an arc chamber 300 is illustrated in FIG. 5, whereby the arc chamber is suited for use in an ion source 301 shown in FIG. 6, where a lifetime of the arc chamber is substantially improved. As illustrated in FIG. 5, the arc chamber 300 comprises a cathode shield 302 (sometimes referred to as a cathode repeller), whereby the cathode shield comprises a U-shaped lip 304 as illustrated in greater detail in FIGS. 7A-7B. The U-shaped lip 304, for example, is positioned at an end 306 of the cathode shield 302, wherein the U-shaped lip generally mates into a recess 308 (e.g., a groove) in an arc chamber liner 310 of the arc chamber 300 of FIG. 5. The recess 308 in the arc chamber liner 310, in conjunction with the U-shaped lip 304 in the cathode shield 302, for example, substantially reduces a conductance of gas into a gap 312 between the cathode shield and a hole 314 in an arc chamber body 316 through which a cathode 318 extends.

In one example, a labyrinth seal 320 is incorporated into the outer diameter of the cathode shield 302, wherein the labyrinth seal is configured to accept a seal 322 (e.g., a boron nitride seal). The seal 322 generally prevents leakage of gas out of the ion source 301 of FIG. 6. Accordingly, as illustrated in FIG. 5, the recess 308 in the arc chamber liner 310 and the U-shaped lip 304 of the cathode shield 302 thus protects a sealing surface 324 between with the seal 322 and the arc chamber body 316 from corrosive gases and by reducing a conductance of the corrosive gases into the gap 312.

Although the invention has been shown and described with respect to a certain embodiment or embodiments, it should be noted that the above-described embodiments serve only as examples for implementations of some embodiments of the present invention, and the application of the present invention is not restricted to these embodiments. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application. Accordingly, the present invention is not to be limited to the above-described embodiments, but is intended to be limited only by the appended claims and equivalents thereof.

The invention claimed is:

1. A cathode shield for an ion source, the cathode shield comprising:
   a body, wherein the body is generally cylindrical and has an axial hole defined therethrough, wherein the axial hole is configured to pass an electrode therethrough;
   a first gas conductance limiter associated with a first end of the body, wherein the first gas conductance limiter extends radially outward from a first outer diameter of the body, wherein the first gas conductance limiter comprises a U-shaped lip extending axially from the first end of the body toward a second end of the body; and
   a second gas conductance limiter associated with the second end of the body, wherein the second gas conductance limiter extends radially inward from the first outer diameter of the body, and wherein the second gas conductance limiter has a surface configured to accept a seal, wherein the surface is configured to generally surround at least a portion of the seal.

2. The cathode shield of claim 1, wherein the U-shaped lip is configured to mate to a recess in a liner of the ion source, wherein a gap is defined between the U-shaped lip and the liner, and wherein the U-shaped lip substantially reduces a conductance of gas into the gap.

3. The cathode shield of claim 2, wherein the gap is further defined between the cathode shield and a hole in an arc chamber body.

4. The cathode shield of claim 1, wherein the second gas conductance limiter comprises a labyrinth seal generally defined by a second outer diameter of the body, wherein the seal comprises a boron nitride seal, and wherein the labyrinth seal is configured to accept the boron nitride seal.

5. The cathode shield of claim 4, wherein the labyrinth seal generally protects a sealing surface associated with the boron nitride seal from corrosive gases associated with the ion source by reducing a gas conductance of the corrosive gases into an area associated with the labyrinth seal.

6. An arc chamber for an ion source, the arc chamber, comprising:
   an arc chamber body;
   an electrode extending into an interior region of the arc chamber body;
   a cathode shield comprising:
      a body, wherein the body is generally cylindrical and has an axial hole defined therethrough, wherein the axial hole is configured to pass the electrode therethrough;
      a first gas conductance limiter associated with a first end of the body, wherein the first gas conductance limiter extends radially outward from a first outer diameter of the body, wherein the first gas conductance limiter comprises a U-shaped lip extending axially from the first end of the body toward a second end of the body; and
      a second gas conductance limiter associated with the second end of the body, wherein the second gas conductance limiter extends radially inward from the first outer diameter of the body, and wherein the second gas conductance limiter has a surface configured to accept a seal, wherein the surface is configured to generally surround at least a portion of the seal; and
   a liner associated with the arc chamber body, wherein the liner has an opening configured to pass the cathode shield therethrough, wherein the liner has a recess defined therein, and wherein a gap is defined between the U-shaped lip and the liner, wherein the U-shaped lip substantially reduces a conductance of gas into the gap.

7. The arc chamber of claim 6, wherein the gap is further defined between the cathode shield and a hole in an arc chamber body.

8. The arc chamber of claim 7, wherein the second gas conductance limiter comprises a labyrinth seal defined by a second outer diameter of the body.

9. The arc chamber of claim 8, wherein the seal comprises a boron nitride seal disposed between the labyrinth seal and the arc chamber body, wherein the boron nitride seal electrically insulates the electrode from the arc chamber body.

10. The arc chamber of claim 9, wherein the labyrinth seal generally protects a sealing surface associated with the boron nitride seal from corrosive gases associated with the ion source by reducing a gas conductance of the corrosive gases into an area associated with the labyrinth seal.

11. An ion source, comprising:
   an arc chamber having an arc chamber body;
   an electrode extending into an interior region of the arc chamber body;
   a cathode shield comprising:
      a body, wherein the body is generally cylindrical and has an axial hole defined therethrough, wherein the axial hole is configured to pass the electrode therethrough;
      a first gas conductance limiter associated with a first end of the body, wherein the first gas conductance limiter extends radially outward from a first outer diameter of the body, wherein the first gas conductance limiter comprises a U-shaped lip extending axially from the first end of the body toward a second end of the body; and a second gas conductance limiter associated with the second end of the body, wherein the second gas conductance limiter extends radially inward from the first outer diameter of the body, and wherein the second gas conductance limiter has a surface configured to accept a seal, wherein the surface is configured to generally surround at least a portion of the seal;

a gas source configured to introduce a gas to the interior region of the arc chamber body; and a liner associated with the arc chamber body, wherein the liner has an opening configured to pass the cathode shield therethrough, wherein the liner has a recess defined therein, and wherein a gap is defined between the U-shaped lip and the liner, wherein the U-shaped lip substantially reduces a conductance of gas into the gap.

12. The ion source of claim 11, wherein the gap is further defined between the cathode shield and a hole in the arc chamber body.

13. The ion source of claim 12, wherein the second gas conductance limiter comprises a labyrinth seal defined by a second outer diameter of the body.

14. The ion source of claim 13, wherein the seal comprises a boron nitride seal disposed between the labyrinth seal and the arc chamber body, wherein the boron nitride seal electrically insulates the electrode from the arc chamber body.

15. The ion source of claim 14, wherein the labyrinth seal generally protects a sealing surface associated with the boron nitride seal from corrosive gases associated with the ion source by reducing a gas conductance of the corrosive gases into an area associated with the labyrinth seal.

16. The ion source of claim 11, further comprising:

a repeller; and an arc slit.

* * * * *